United States Patent
Kim et al.

(10) Patent No.: US 7,285,967 B2
(45) Date of Patent: Oct. 23, 2007

(54) PROBE CARD HAVING DEEPLY RECESSED TRENCH AND METHOD FOR MANUFACTURING THE SAME

(75) Inventors: Bong Hwan Kim, Seoul (KR); Kukjin Chun, Seoul (KR); Doo Yun Chung, Seoul (KR); Chi Hwan Jeong, Seoul (KR)

(73) Assignee: UniTest Inc., Gyeonggi-do (KR)

( * ) Notice: Subject to any disclaimer, the term of this patent is extended or adjusted under 35 U.S.C. 154(b) by 0 days.

(21) Appl. No.: 11/281,365

(22) Filed: Nov. 18, 2005

(65) Prior Publication Data

US 2006/0109017 A1     May 25, 2006

(30) Foreign Application Priority Data

Nov. 24, 2004   (KR)   ................... 10-2004-0096875

(51) Int. Cl.
 *G01R 31/02*   (2006.01)
(52) U.S. Cl. ................................. 324/754
(58) Field of Classification Search ................ 324/754, 324/72.5, 761, 762, 765, 158.1, 757–758, 324/767
See application file for complete search history.

(56) References Cited

U.S. PATENT DOCUMENTS

| 6,087,840 | A | 7/2000 | Mizuta |
| 6,114,864 | A * | 9/2000 | Soejima et al. ............. 324/754 |
| 6,452,407 | B2 * | 9/2002 | Khoury et al. ............. 324/754 |
| 6,724,204 | B2 | 4/2004 | Cho et al. |
| 6,922,069 | B2 | 7/2005 | Jun |

* cited by examiner

*Primary Examiner*—Ha Tran Nguyen
*Assistant Examiner*—Tung X. Nguyen
(74) *Attorney, Agent, or Firm*—Sughrue Mion, PLLC

(57) ABSTRACT

The present invention relates to a probe card that a probe of the probe card is movable only in a vertical direction using a trench to improve a electrical or a mechanical characteristic and to automatically limit the vertical movement thereof within a predetermined range. A pitch may be reduced so as to correspond to a decreasing distance between pads. A flatness of a probe tip may be maintained within a few micrometers using a semiconductor manufacturing process. 32 simultaneous parallel testing is possible contrary to a convention probe card. A wafer level testing is possible, and time and cost for a wafer testing are reduced.

11 Claims, 4 Drawing Sheets

(PRIOR ART)

PROBE CARD HAVING DEEPLY RECESSED TRENCH AND METHOD FOR MANUFACTURING THE SAME

RELATED APPLICATIONS

The present disclosure relates to subject matter contained in priority Korean Application No. 10-2004-0096875 filed on 24 Nov. 2004, which is herein expressly incorporated by reference in its entirety.

BACKGROUND OF THE INVENTION

1. Field of the Invention

The present invention relates to a probe card having a deeply recessed trench and a method for manufacturing the same, and more particularly to a probe card having a deeply recessed trench and a method for manufacturing the same wherein the probe card is manufactured using the single crystalline silicon substrate and an oxide film or a nitride film is used as an insulating film to facilitate a signal separation between the probes, wherein the probe is movable only in a vertical direction using a trench to improve an electrical or a mechanical characteristic and to automatically limit the vertical movement thereof within a predetermined range, and wherein a pitch may be reduced so as to correspond to a decreasing distance between pads, a flatness of a probe tip may be maintained within a few micrometers using a semiconductor manufacturing process, 32 simultaneous parallel testing is possible contrary to a convention probe card, a wafer level testing is possible, and time and cost for a wafer testing are reduced.

2. Background of the Invention

Generally, during a manufacturing process of a semiconductor integrated circuit such as a memory device, a non-memory device or a logic device, a test for determining defectiveness of each of chips is performed after manufacturing the chips on a wafer. The test is carried out by connecting the probe card to a probe testing device and applying a signal to the chip to be tested with probe tips of the probe card being in contact with pads of the chip to be tested.

Since a force of 1 gram force per tip is applied to between the probe tips of the probe testing device and testing wafer including the chip to be tested, the probe tip must withstand this force, and must have a reliability to endure about one million contacts with the wafer. Moreover, a contact resistance of the probe tip should be less than 1 ohm, and a pitch should be less than 45 μm to correspond to a miniaturized semiconductor chip design.

A detailed description of a conventional probe card is disclosed in Korean Patent Application No. 10-2002-0076050 filed on Dec. 2, 2002 by the applicant, titled "Cantilever-Type Probe Card and Method for manufacturing the Same Using Silicon Micromachining Technology".

As disclosed in Korean Patent Application No. 10-2002-0076050, the conventional probe card is disadvantageous in an aspect of carrying out mass testing of wafer. For example, in accordance with U.S. Pat. No. 6,087,840 which is referred to as a conventional art in Korean Patent Application No. 10-2002-0076050, a pitch of a pad cannot be reduced below 50 μm because a tungsten needle (probe needle) is manually mounted, and an entire wafer cannot be tested in a single test so that relatively more time and cost is required. Other conventional arts disclosed in Korean Patent Application No. 10-2002-0076050 are also disadvantageous in that the probe card is sensitive to external shock or a temperature change, the pitch cannot be reduced below 50 μm, and a parallel test is difficult. Moreover, a wafer level test wherein the entire wafer is tested at once cannot be carried out, and each chip should be tested separately, resulting in a long testing time and a high testing cost.

In order to solve such problem, Korean Patent Application No. 10-2002-0076050 discloses a cantilever type probe card and a method for manufacturing the same wherein a through-hole is formed at an edge portion of a silicon substrate such as SOI (Silicon On Insulator) substrate, the through-hole is filled up with a conductive layer, a spring and a tip are then formed at a center portion of the SOI substrate by a photo lithography and etching process, a metal line electrically connected to the conductive layer in the through-hole is formed, and the conductive layer in the through-hole is then bonded to, a metal line of a printed circuit board.

FIG. 1 is a cross-sectional view illustrating a configuration of a conventional probe card.

As shown, the cantilever type probe card in accordance with Korean Patent Application No. 10-2002-0076050 comprises a printed circuit board 110 and SOI substrate 120. A through-hole 125 is formed in the SOI substrate 120 to be connected to the printed circuit board 110, an end portion 130 of a tip and a spring 135 are formed, a conductive material 138 is formed so that an electrical signal may be applied from printed circuit board 110 to a pad 165 of a wafer the substrate 160 to be tested. The end portion 130 of the tip and the spring 135 are hereinafter referred to as a probe tip and a probe beam, respectively.

However, while a configuration of the cantilever type probe card in accordance with Korean Patent Application No. 10-2002-0076050 is advantageous in that a pitch between tips may be reduced and more than 32 parallel tests and a wafer level test are possible, a contact between the probe beams or a damage of the probe beam may occur due to a horizontal movement of the probe beams when a force is applied diagonally instead of vertically. Actually, when a pressure is applied to the probe beam, a possibility of the damage and malfunction of the probe tip is increased during an actual test because a lateral force as well as a completely vertical force exists.

In order to solve above-described problem, Korean Patent Application No. 10-2003-0022937, filed by Yulim Hitech Inc. on Apr. 11, 2003 and published on Oct. 10, 2004 titled "Needle Assembly of Probe Card" disclose a configuration wherein a horizontal movement of a probe tip due to a lateral force component is prevented by forming a needle moving hole.

FIG. 2 is a cross-sectional view illustrating a configuration of the probe card disclosed by Korean Patent Application No. 10-2003-0022937. As shown, in accordance with the probe card disclosed in Korean Patent Application No. 10-2003-0022937, a needle plate 220 is allowed to only move vertically through a movable gap 215 and a moving hole 210 even when the lateral force component with respect to the needle plate 220 exists to reduce the possibility of the damage and malfunction of the probe tip.

Particularly, in accordance with the configuration of the probe card disclosed by Korean Patent Application No. 10-2003-0022937, the needle plate 220 moves inside the moving hole 210, that is, in the vertical direction to solve an instability that may occur when a width of the probe beam is smaller than a thickness thereof as a distance between pads is reduced. Therefore, a probe having a stable configuration for corresponding to the reduced pitch is provided.

However, while the configuration of the probe card disclosed by Korean Patent Application No. 10-2003-0022937 reduces the possibility of the damage and malfunction of the probe, and the pitch, a metal line process cannot be carried out directly on the silicon substrate so that the metal line process should be carried out through the interface board 240 and a metal line for testing is formed between the interface board 240 and the printed circuit board (not shown) because of the moving hole 210 in the silicon substrate. Therefore, a configuration of the testing device is very complex.

SUMMARY OF THE INVENTION

It is an object of the present invention to provide a probe card having a deeply recessed trench and a method for manufacturing the same wherein the probe card is manufactured using the single crystalline silicon substrate and an oxide film or a nitride film is used as an insulating film to facilitate a signal separation between the probes, wherein the probe is movable only in a vertical direction using a trench to improve a electrical or a mechanical characteristic and to automatically limit the vertical movement thereof within a predetermined range, and wherein a pitch may be reduced so as to correspond to a decreasing distance between pads, a flatness of a probe tip may be maintained within a few micrometers using a semiconductor manufacturing process, 32 simultaneous parallel testing is possible contrary to a convention probe card, a wafer level testing is possible, and time and cost for a wafer testing are reduced.

In order to achieve the above-described objects of the present invention, there is provided a probe card comprising: a plurality of probes of a cantilever type consisting of a probe tip and a probe beam; a single crystalline silicon substrate having a plurality of through-hole contact members disposed therein, each of the plurality of the through-hole contact members having a conductive material therein for electrically connecting each of the plurality of the probes to a test circuit, a plurality of trenches disposed in the substrate, the plurality of trenches having the plurality of the probes attached thereto so as to guide a movement of the plurality of the probes in a vertical direction, and an insulating film for insulating a portion of the conductive material other than a portion where the plurality of the probes is in a direct contact with the conductive material; and a printed circuit board including the test circuit, wherein a test is performed by applying an electrical signal from the printed circuit board to the probe to transmit an electrical signal detected from the probe to the printed circuit board through a connection between a contacting portion of the printed circuit board and the conductive material in the through-hole contact member.

In order to achieve the above-described objects of the present invention, there is also provided a testing device for performing a wafer level test, the device comprising the probe card of the present invention.

In order to achieve the above-described objects of the present invention, there is also provided a method for manufacturing a probe card having a deeply recessed trench, the method comprising steps of: forming a through-hole in a single crystalline silicon substrate; forming an insulating film in the single crystalline silicon substrate having the through-hole; filling a conductive material in the through-hole where the insulating film is formed, thereby forming a through-hole contact member; forming a trench by an etching; forming a portion where a probe is to be attached by an etching; forming an insulating film exposing a portion where the probe and the through-hole contact member are to be in contact; bonding a wafer including the probe and the single crystalline silicon substrate so that the probe is in the trench; and separating the single crystalline silicon substrate including the probe from the wafer.

DETAILED DESCRIPTION OF THE INVENTION

A probe card having a deeply recessed trench and a method for manufacturing the same in accordance with the present invention will now be described in detail with reference to the accompanied drawings.

Figure 1:
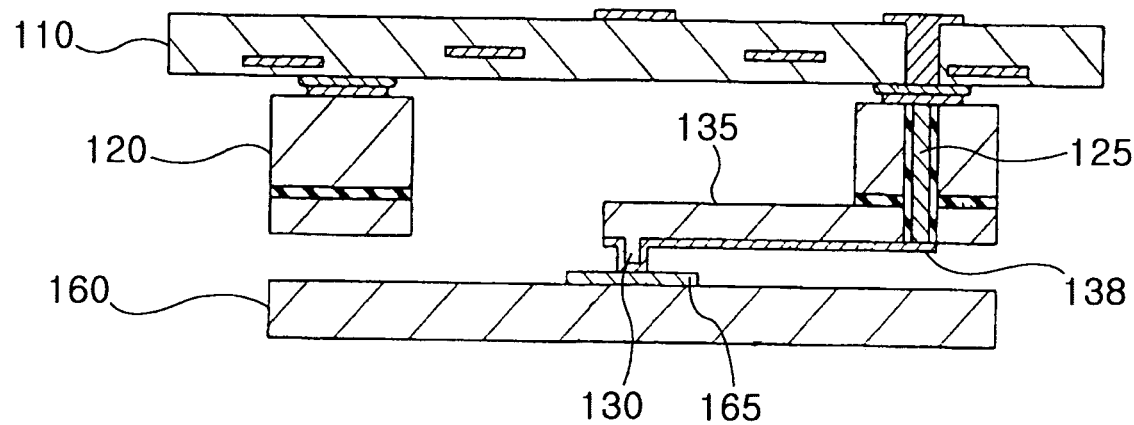
FIG. 1 is a cross-sectional view illustrating a configuration of a conventional probe card.
Figure 2:
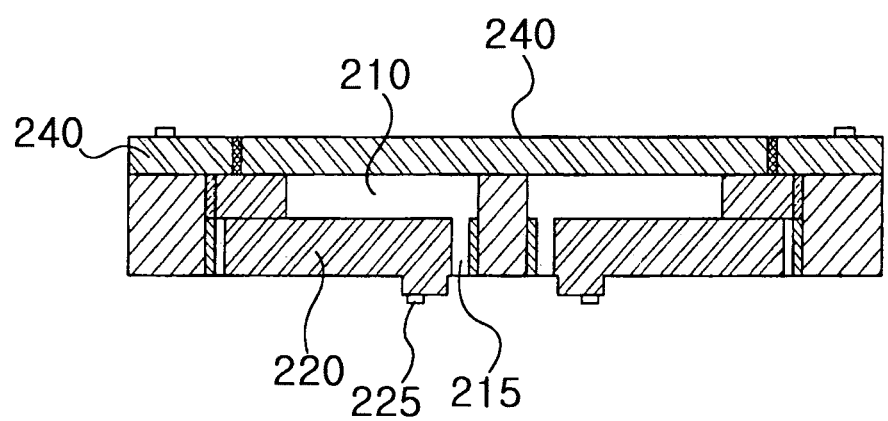
FIG. 2 is a cross-sectional view illustrating a configuration of a conventional probe card.
Figure 3:
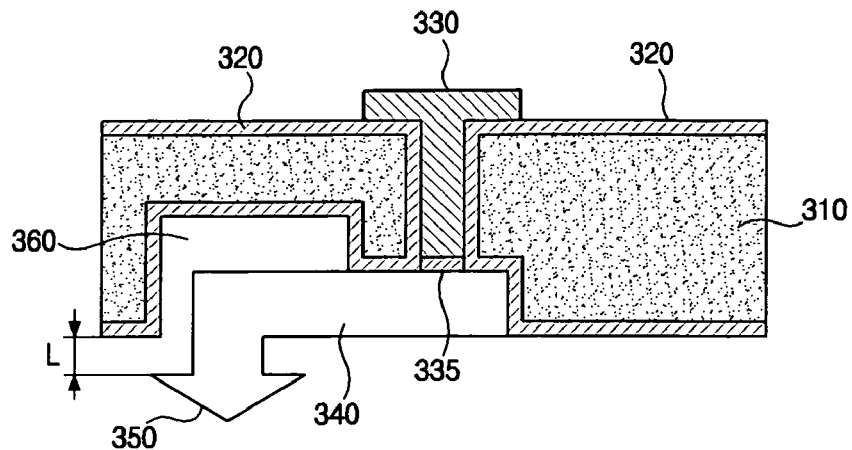
FIG. 3 is a cross-sectional view illustrating a probe card having a deeply recessed trench in accordance with the present invention.

FIG. 3 is a cross-sectional view illustrating a probe card having a deeply recessed trench in accordance with the present invention. Although the probe card having the deeply recessed trench in accordance with the present invention comprises a plurality of probes of a cantilever type consisting of a probe tip 350 and a probe beam 340, and a structure formed in a single crystalline silicon substrate 310, only a single probe is shown in FIG. 3 for a convenience of description.

Referring to FIG. 3, a trench 360 for guiding a movement of the probe in a vertical direction is formed in the single crystalline silicon substrate 310, and a through-hole penetrating the single crystalline silicon substrate 310 is formed and by filling the through-hole with a conductive material, a through-hole contact member 330 is formed. The through-hole contact member establishes an electrical connection to the probe.

In addition, a portion which is in a direct contact with the probe is covered with the insulating film 320 except a contacting portion 335 which is in contact with the through-hole contact member 330 so as to prevent a mis-transmission of a signal by a contact with the probe.

Moreover, the insulating film 320 is also formed in the trench 360 to prevent a mis-transmission of a signal. The insulating film 320 is, for example, an oxide film or a nitride film.

Although not shown, the probe card of the present invention may further comprise a printed circuit board including the test circuit, and an electrical signal from the printed circuit board is applied to the probe to transmit an electrical signal detected from the probe to the printed circuit board by connecting the contacting portion of the printed circuit board to the through-hole contact member 330 in the through-hole.

The probe is preferably composed of a material selected from the group consisting of Cu and an alloy containing Cu including Be—Cu.

Alternatively, the probe is composed of a material selected from the group consisting of Ni or an alloy containing Ni including Ni—W, Ni—Co, Ni—Mn, Ni—Fe and Ni—Cr.

The probe is preferably, manufactured on a wafer (not shown) which is separated after bonding the probe to the single crystalline silicon substrate.

The through-hole contact member 330 comprises a conductive material for electrically connecting the probe to a test circuit.

In one embodiment of the invention, the through-hole contact member 330 can further comprise an undoped polysilicon layer disposed on the insulating film 320. The conductive material is disposed on the undoped polysilicon layer by an electro-plating in this embodiment.

In another embodiment of the invention, the through-hole contact member 330 can further comprise an undoped polysilicon layer disposed on the insulating film 320. The conductive material is disposed on the undoped polysilicon layer by an electro-plating in this embodiment.

In still another embodiment of the invention, the through-hole contact member 330 can further comprise an undoped polysilicon layer disposed on the insulating film 320. The conductive material is disposed—on the undoped polysilicon layer by depositing a CVD tungsten film in this embodiment.

In still another embodiment of the invention, the through-hole contact member 330 can further comprise an undoped polysilicon layer disposed on the insulating film 320 and a CVD Cu film deposited as a seed layer. The conductive material is disposed on the CVD Cu film in this embodiment.

In still another embodiment of the invention, the through-hole contact member 330 can further comprise an undoped polysilicon layer disposed on the insulating film and a CVD tungsten film deposited on the undoped polysilicon layer. Au is deposited on the CVD tungsten film as the conductive material in this embodiment.

The probe card having the deeply recessed trench in accordance with the present invention and the probe card disclosed in Korean Patent Application No. 10-2003-0022937 are similar in that a vertical movement of the probe is guided using a trench or a needle moving hole. However, while a metal line forming process cannot be carried out directly on a substrate because of a use of the needle moving hole in the conventional art, the metal line forming process can be carried out directly on the substrate because the trench is used in the present invention. Therefore, an interface board for a metal line is not required in accordance with the present invention contrary to the conventional art.

A manufacturing of the probe, a formation of the through-hole contact member 330 and a formation of an insulating film 320 will be described along with a description of a method for manufacturing a probe card having a deeply recessed trench.

In addition, "L" in drawings denotes a distance between the probe tip 350 and the single crystalline silicon substrate 310, and the vertical movement of the probe is limited to the distance L.

Figure 4:
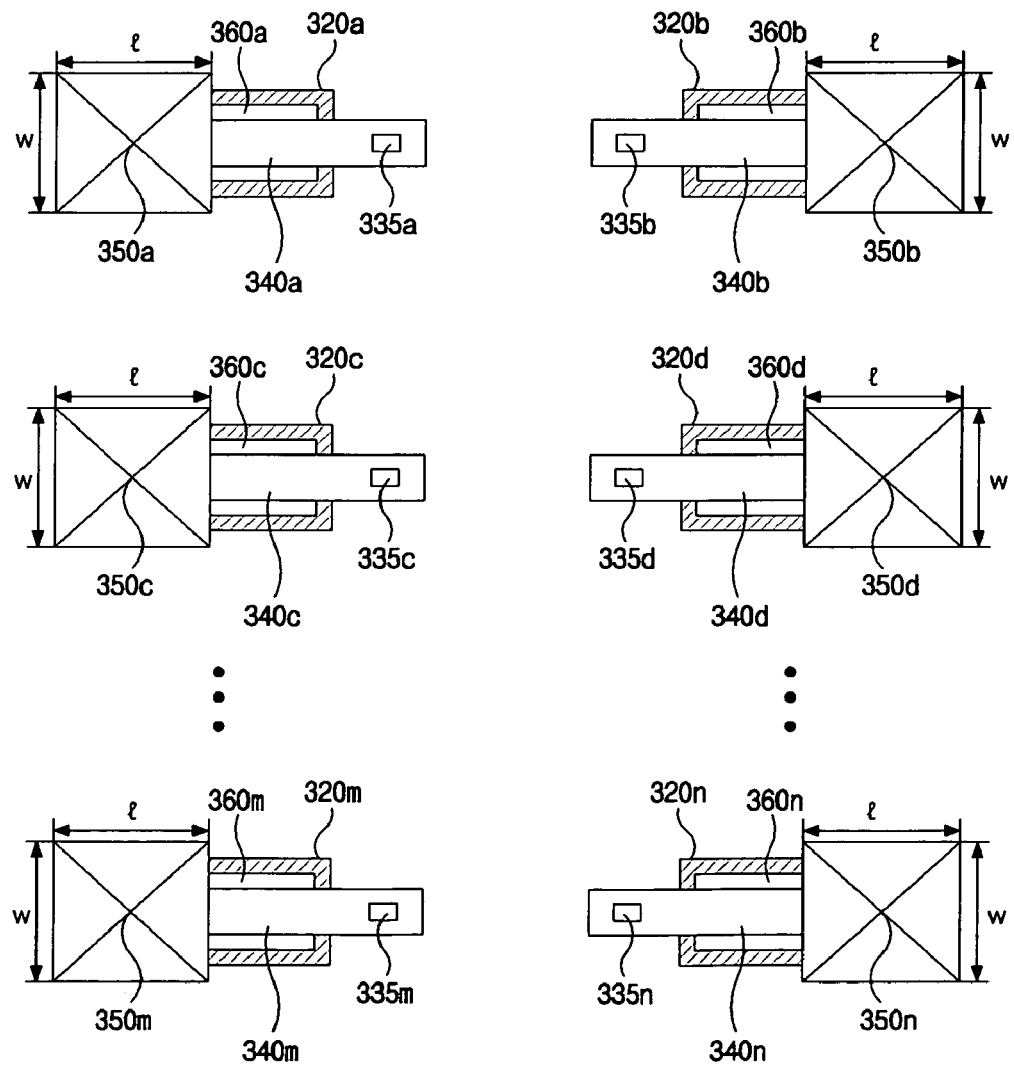
FIG. 4 is a bottom view illustrating a probe card having a deeply recessed trench in accordance with the present invention.

FIG. 4 is a bottom view illustrating a probe card having a deeply recessed trench in accordance with the present invention. As shown, a plurality of probes consisting of probe tips 350a through 350n and probe beams 340a through 340n, a plurality of contacting portion 335a through 335n for connecting the through-hole contact member 330 of the single crystalline silicon substrate and the plurality of the probes, insulating films 320a through 320n for insulating each of the plurality of the probes and the single crystalline silicon substrate, and a plurality of trenches 360a through 360n for guiding a vertical movement of each of the plurality of the probes are formed on a backside of the single crystalline silicon substrate.

In addition, a length or a width of each of the probe tips 350a through 350n is larger than a width of the trench so that each of the probe tips 350a through 350n may move vertically within the distance denoted as "L" in FIG. 3. The probe tip has a pyramid shape or a polygonal cone.

FIGS. 5a through 5e are cross-sectional views illustrating a method for manufacturing a probe card having a deeply recessed trench in accordance with the present invention.

Figure 5A:
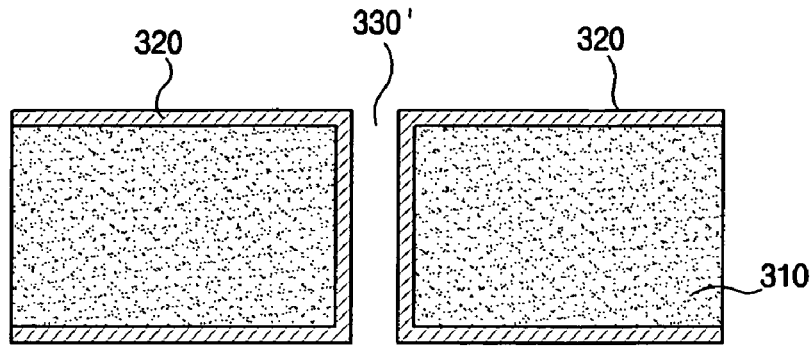
FIGS. 5a through 5e are cross-sectional views illustrating a method for manufacturing a probe card having a deeply recessed trench in accordance with the present invention.

Referring to FIG. 5a, the through-hole 330' is formed by etching the single crystalline silicon substrate 310 which is commonly used for semiconductor devices.

Thereafter, the insulating film 320 is formed on an inner surface of the through-hole 330'.

Figure 5B:
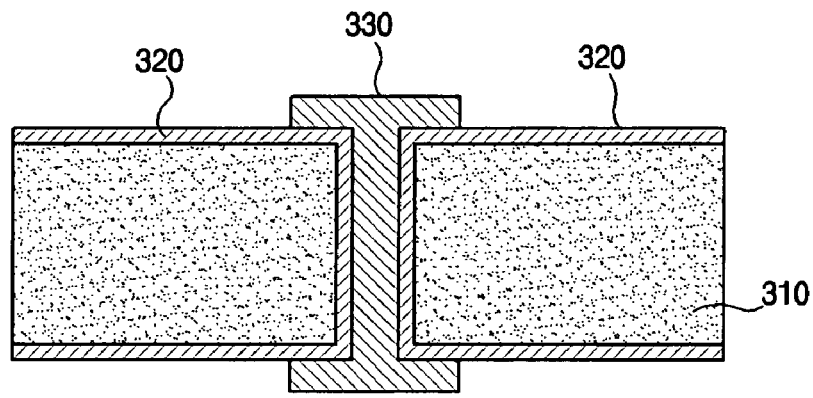

Referring to FIG. 5b, the conductive material is filled in the through-hole 330', thereby the through-hole contact member 330 is formed.

The filling the through-hole 330' may be carried out by various methods. For example, an undoped polysilicon is formed via a deposition, and then an Au layer is formed as a seed layer, and finally the conductive material is filled in the through-hole by an electro-plating or an electroless plating.

Alternatively, an undoped polysilicon is deposited, and the conductive material is electroplated by depositing a CVD tungsten film. In one embodiment, an undoped polysilicon layer is formed, and then the conductive material is formed using a CVD film as a seed layer, or an undoped polysilicon layer is formed, and then the conductive material is formed using a CVD film, and finally Au is deposited to be filled up by the conductive material.

Figure 5C:
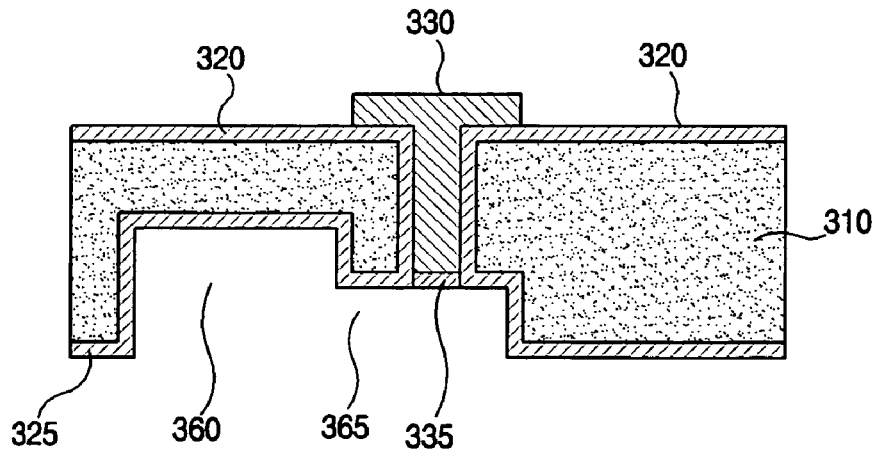

Referring to FIG. 5c, a trench is formed by etching a bottom surface of the insulating film 320 and forming a space for attaching a cantilever type probe.

For example, the trench 360 of the single crystalline silicon substrate 310 as well as the space 365 for attaching the probe may be etched via a dry etching. Thereafter, an insulating film 325 is formed such that a surface of the single crystalline silicon substrate is insulated except a contacting portion 335 where the through-hole contact member 330 and the probe contact each other.

Figure 5D:
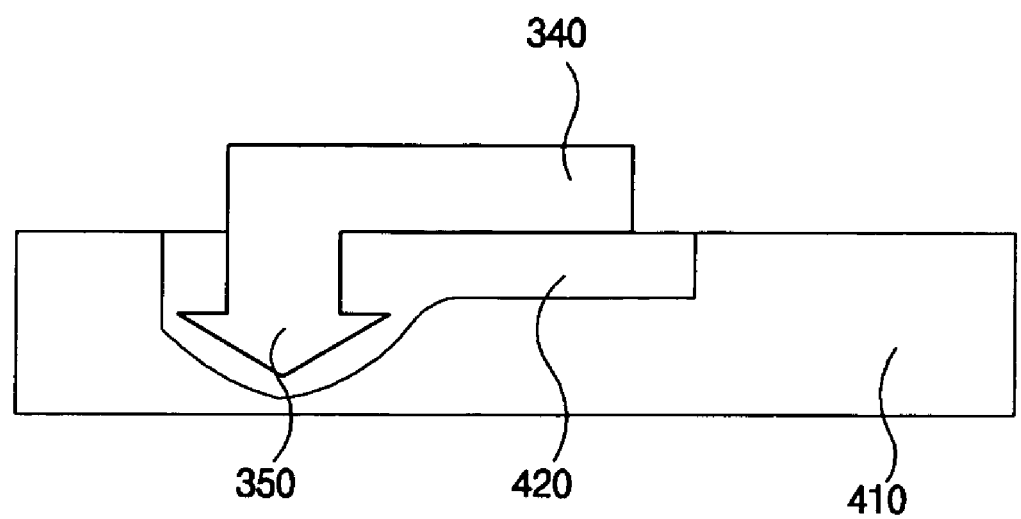

Referring to FIG. 5d, a cantilever type probe is manufactured on a wafer. An etching of a wafer is performed to form a probe tip and a probe beam.

As shown, a space for forming the probe tip 350 and the probe beam 340 is formed in the wafer 410 by etching, an oxide film 420 is formed therein, and the probe tip 350 and the probe beam 340 are then formed.

The probe tip 350 and the probe beam 340 may be formed by an electro-plating, a CVD or a sputtering using Cu or an alloy containing Cu such as Be—Cu.

Alternately, the probe tip 350 and the probe beam 340 may be formed by an electro-plating, a CVD or a sputtering using Ni or an alloy containing Ni such as Ni—W, Ni—Co, Ni—Mn, Ni—Fe or Ni—Cr.

The oxide film 420 facilitates a separation of the probe, and removed by an etching process when the probe is separated after being attached.

Figure 5E:
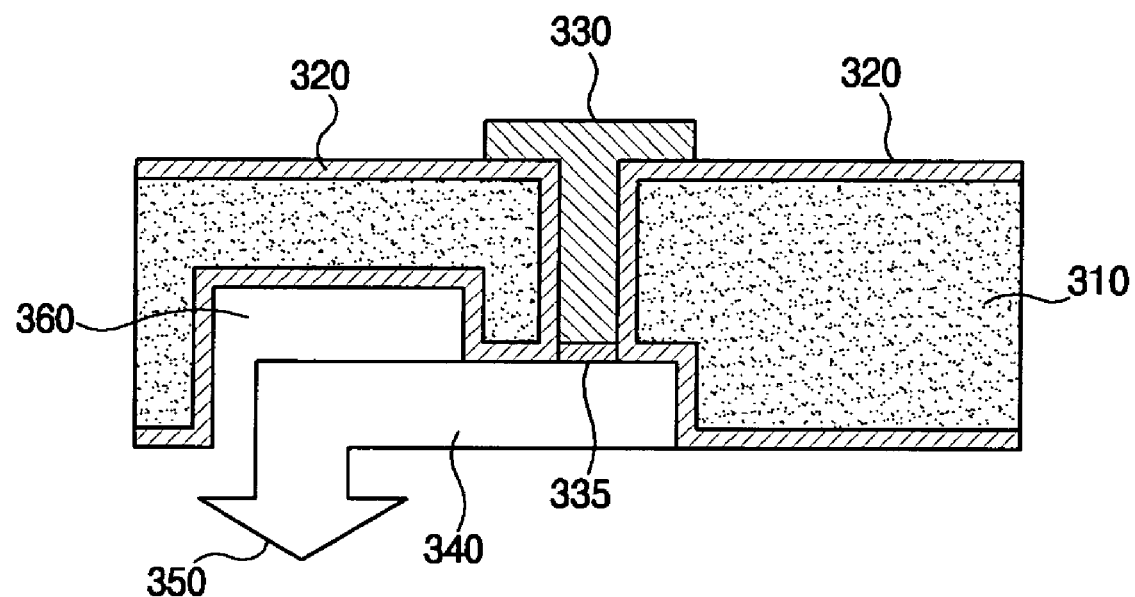

Referring to FIG. 5e, after the single crystalline silicon substrate 310 of FIG. 5c and the wafer 410 including the probe manufactured through the process of FIG. 5d are bonded, the wafer 410 is separated from the single crystalline silicon substrate 310 The single crystalline silicon substrate 310 having the trench therein and the wafer 410 having the probe thereon may be bonded via an electro-plating process using a material such as PbSn, AuSn, and BiSn.

When the wafer 410 is separated after the bonding, the probe consisting of the probe tip 350 and the probe beam 340 are attached to the single crystalline silicon substrate 310.

Thereafter, the complete probe card is connected to a printed circuit board using a lead, and protected by a resin such as an epoxy.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. A probe card comprising: a plurality of probes of a cantilever type consisting of a probe tip and a probe beam; a single crystalline silicon substrate having a plurality of through-hole contact members disposed therein, each of the plurality of the through-hole contact members having a conductive material therein for electrically connecting each of the plurality of the probes to a test circuit, a plurality of trenches disposed in the substrate, the plurality of trenches having the plurality of the probes attached thereto so as to guide a movement of the plurality of the probes in a vertical direction, and an insulating film for insulating a portion of the conductive material other than a portion where the plurality of the probes is in a direct contact with the conductive material; and a printed circuit board including the test circuit, wherein a test is performed by applying an electrical signal from the printed circuit board to the probe to transmit an electrical signal detected from the probe to the printed circuit board through a connection between a contacting portion of the printed circuit board and the conductive material in the through-hole contact member.

2. The probe card in accordance with claim 1, wherein a width or a length of the probe tip is larger than a width of the trench so as to limit the movement in the vertical direction.

3. The probe card in accordance with claim 1, wherein the probe is composed of a material selected from the group consisting of Cu and an alloy containing Cu including Be—Cu.

4. The probe card in accordance with claim 1, wherein the probe is composed of a material selected from the group consisting of Ni or an alloy containing Ni including Ni—W, Ni—Co, Ni—Mn, Ni—Fe and Ni—Cr.

5. The probe card in accordance with claim 1, wherein the insulating film is an oxide film or a nitride film.

6. The probe card in accordance with claim 1, wherein the through-hole contact member further comprising: a undoped polysilicon layer disposed on the insulating film, wherein the conductive material is disposed on the undoped polysilicon layer by an electro-plating.

7. The probe card in accordance with claim 1, wherein the through-hole contact member further comprising: a undoped polysilicon layer disposed on the insulating film; an Au seed layer disposed on the undoped polysilicon layer, wherein the conductive material is disposed on the Au seed layer by an electro-plating.

8. The probe card in accordance with claim 1, wherein the through-hole contact member further comprising: a undoped polysilicon layer disposed on the insulating film; wherein the conductive material is disposed on the undoped polysilicon layer by depositing a CVD tungsten film.

9. The probe card in accordance with claim 1, wherein the through-hole contact member further comprising: a undoped polysilicon layer disposed on the insulating film; and a CVD Cu film deposited as a seed layer, wherein the conductive material is disposed on the CVD Cu film.

10. The probe card in accordance with claim 1, wherein the through-hole contact member further comprising: a undoped polysilicon layer disposed on the insulating film; and a CVD tungsten film deposited on the undoped polysilicon layer, wherein Au is deposited on the CVD tungsten film as the conductive material.

11. A testing device for performing a wafer level test, the device comprising a probe card in accordance with one of claims 1, 2 and 3 through 10.

* * * * *